(12) United States Patent
Myers et al.

(10) Patent No.: US 6,496,010 B1
(45) Date of Patent: Dec. 17, 2002

(54) POWER SYSTEM HAVING PRESSED ELECTRICAL CONTACTS AND WHICH DETECTS FAULTS IN THE CONTACTS

(75) Inventors: Nicholas Tyson Myers, Chandler, AZ (US); James Dunbar Walker, Escondido, CA (US)

(73) Assignee: Unisys Corporation, Blue Bell, PA (US)

( * ) Notice: Subject to any disclaimer, the term of this patent is extended or adjusted under 35 U.S.C. 154(b) by 1 day.

(21) Appl. No.: 09/779,420

(22) Filed: Feb. 7, 2001

(51) Int. Cl.[7] .......................... G01R 31/00; H01H 31/02
(52) U.S. Cl. ....................................... 324/500; 324/537
(58) Field of Search ............................. 324/754, 756, 324/500, 771, 758, 537

(56) References Cited

U.S. PATENT DOCUMENTS 4,841,231 A * 6/1989 Angelucci ................. 324/73.1
5,818,247 A * 10/1998 Pyun ......................... 324/756
6,325,662 B1 * 12/2001 Tustaniwskyj ............. 439/482

* cited by examiner

*Primary Examiner*—Vinh P. Nguyen
*Assistant Examiner*—Paresh Patel
(74) *Attorney, Agent, or Firm*—Charles J. Fassbender; Mark T. Starr; Lise A. Rode (57) ABSTRACT

A power system includes an output voltage terminal that is coupled by a first conductor to one pressed power contact which is then coupled by a second conductor to an electronic device. Also, the electronic device is coupled by a third conductor to one pressed signal contact which is then coupled by a fourth conductor to an output voltage feedback terminal on the power supply. Further, the power system includes a fault detection circuit which is coupled to the fourth conductor. In operation, the fault detection circuit senses if the pressed signal contact is open at a time when the pressed signal contact is supposed to be closed. If an open contact is sensed, the fault detection circuit sends a signal to an operator which indicates that corrective action is needed.

12 Claims, 9 Drawing Sheets

POWER SYSTEM HAVING PRESSED ELECTRICAL CONTACTS AND WHICH DETECTS FAULTS IN THE CONTACTS

BACKGROUND OF THE INVENTION

This invention relates to systems which deliver electrical power to a subassembly of electronic devices, such as a subassembly of one or more integrated circuit chips on a printed circuit board, thru pressed electrical contacts. Each such contact includes two mating terminals that get pressed together.

In a conventional printed circuit board of the prior art, electrical power is received thru a connector that is attached to one edge of the board. Typically, the connector has several cylindrical-shaped pins that slide into corresponding holes of a socket which is mounted to a backplane. Electrical power from a power supply travels along conductors in the backplane to the socket, and then travels through the pins and along conductors on the printed circuit board to the electronic devices.

However, a problem with the above conventional practice is that the conductors which couple the electronic devices on the printed circuit board to the power supply inherently have a parasitic capacitance, a parasitic inductance, and a parasitic resistance. Those parasitic parameters limit the ability of the power supply to keep the voltage constant at the electronic devices.

One way to reduce the above parasitic parameters is to shorten the conductors which couple the electronic devices to the power supply. This can be achieved by mounting the power supply on a second printed circuit board which is held parallel to the printed circuit board that holds the electronic devices; providing mating electrical terminals on two surfaces of the printed circuit boards that face each other; and pressing mating terminals together.

But, if the above two printed circuit boards somehow get misaligned, the open circuits or abnormally high resistances can occur between the mating terminals. In that case, the power supply will again be unable to properly deliver power to the electronic devices.

Accordingly, a primary object of the present invention is to overcome the above problem.

BRIEF SUMMARY OF THE INVENTION

A power system, which constitutes one preferred embodiment of the present invention, includes a power supply that has an output voltage terminal and an output voltage feedback terminal. The output voltage terminal is coupled by a first conductor to one pressed power contact which is then coupled by a second conductor to an electronic device. Also, the electronic device is coupled by a third conductor to one pressed signal contact which is then coupled by a fourth conductor to the output voltage feedback terminal on the power supply.

Further, and in accordance with the present invention, the power system includes a fault detection circuit which is coupled to the fourth conductor. In operation, the fault detection circuit senses if the pressed signal contact is open at a time when the pressed signal contact is supposed to be closed. If an open contact is sensed, the fault detection circuit sends a signal to an operator which indicates that corrective action is needed.

Preferably, the power supply and the fault detection circuit are mounted on a first printed circuit board; the electronic device is mounted on a second printed circuit board; and the pressed power contact as well as the pressed signal contact lie on two surfaces that face each other on the first and second printed circuit boards. This structure enables the power supply to be very close to the electronic device; and that enables the first, second, third and fourth conductors to be short. Thus, the parasitic capacitance, parasitic inductance and parasitic resistance of those conductors will be small; and in addition, any open circuit fault in the pressed signal contact will be detected.

DETAILED DESCRIPTION

Figure 1:
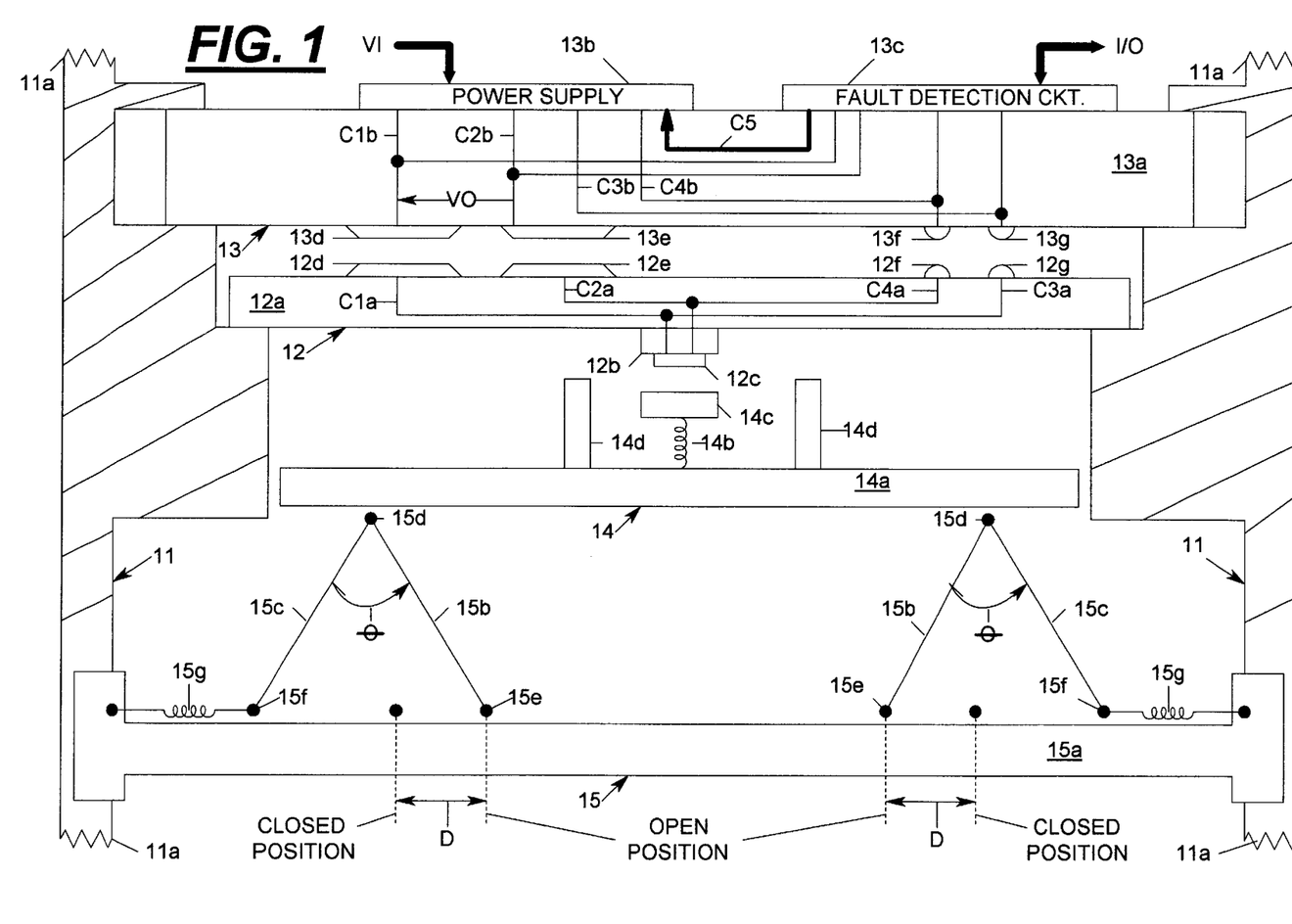
FIG. 1 shows an overview of a power system which constitutes one preferred embodiment of the present invention.

Reference should now be made to FIG. 1 which shows an overview of a power system that constitutes one preferred embodiment of the present invention. This FIG. 1 system is comprised of a frame 11 which holds four different subassemblies that are identified by reference numerals 12, 13, 14 and 15. In FIG. 1, only a portion of the frame 11 is shown; and this is indicated by the jagged lines 11a. In the complete frame 11, all of subassemblies 12–15 are repeated several times, as desired, in the order shown.

One major function of each of the subassemblies 12–15 is as follows. Subassembly 12 holds an electronic device 12c, such as a packaged integrated circuit chip, that is to be tested. Subassembly 13 provides electrical power to the electronic device 12c. Subassembly 14 regulates the temperature of the electronic device 12c. And, subassembly 15 presses the subassemblies 12, 13 and 14 together.

In addition, and in accordance with the present invention, subassembly 14 performs a second major function. This second function is to detect the presence of certain faults that can occur in two pressed signal contacts 12f–13f and 12g–13g which carry feedback signals from subassembly 12 to subassembly 13. How this fault detection operates will be described later in conjunction with FIGS. 3A–3E.

Structure of Subassembly 12

Included within the subassembly 12 are all of the components 12a thru 12g and C1a thru C4a. Component 12a is a printed circuit board. Component 12b is a socket, that is mounted on the printed circuit board 12a, for holding the electronic device 12c.

Component 12d is a power terminal that receives a positive voltage (VO) from a mating power terminal 13d on the subassembly 13. The power terminal 12d, together with the mating power terminal 13d, constitute one pressed power contact 12d–13d between the subassemblies 12 and 13.

Component 12e is a power terminal that receives a reference voltage (ground) from a mating power terminal 13e on the subassembly 13. The power terminal 12e, together with the mating power terminal 13e, constitute another pressed power contact 12e–13e between the subassemblies 12 and 13.

Component 12f is a signal terminal that sends a positive voltage feedback signal to a mating signal terminal in the subassembly 13. The signal terminal 12f, together with the mating signal terminal 13f, constitute one pressed signal contact 12f–13f between the subassemblies 12 and 13.

Component 12g is a signal terminal that sends a reference voltage feedback signal to a mating signal terminal 13g in the subassembly 13. The signal terminal 12g, together with a mating signal terminal 13g in the subassembly 13, constitute another pressed signal contact 12g–13g between the subassemblies 12 and 13.

Components C1a–C4a are four conductors on the printed circuit board 12a. Conductor C1a carries all of the load current from the power contact 12d to a power input terminal on the socket 12b. Conductor C2a carries all of the load current from a power output terminal on the socket 12b back to the power contact 12e. Conductor C3a carries a positive voltage feedback signal from the power input terminal on the socket 12b to the signal terminal 12g. And conductor C4a carries a reference voltage feedback signal from the power output terminal on the socket 12b to the signal terminal 12f.

Structure of Subassembly 13

Included within the subassembly 13 are all of the components 13a thru 13g, C1b thru C4b, and C5. Component 13a is a printed circuit board. Component 13b is a power supply which receives an input voltage VI and generates an output voltage VO across two conductors C1b and C2b. The conductor C1b carries all of the load current from the power supply 13b to the power terminal 13d. The conductor C2b returns all of the load current from the power terminal 13e to the power supply 13b. Component C3b is a conductor which carries the positive voltage feedback signal from terminal 13f to the power supply 13b. And, component C4b is a conductor which carries the reference voltage feedback signal from terminal 13g to the power supply 13b.

In accordance with the present invention, component 13c is a fault detection circuit on the printed circuit board 13a which detects faults in the pressed signal contacts 12f–13f and 12g–13g. The particular type of faults which are detected are those which cause an abnormally high resistance from terminal 12f to terminal 13f, or from terminal 12g to terminal 13g.

The above faults occur if terminal 12f is misaligned with terminal 13f, or if terminal 13f is misaligned with terminal 13g. Such misalignments can be due to various manufacturing tolerances in the dimensions of the frame 11, the subassembly 12, and the subassembly 13. As the degree of misalignment increases, a decreasing portion of the mating terminals get pressed together. Thus, the electrical resistance between the mating terminals increases with the degrees of misalignment and eventually increases to an open circuit.

The power terminals are essentially not susceptible to the above misalignment problem because those terminals must be much larger in size in order to carry all of the load current for the electronic device 12c. When the electronic device 12c is an integrated circuit chip, the typical load current is about one-hundred amps. By comparison, the typical current through the signal terminals is only about one milliamp. Thus, to have the same current density in the power terminals and the signal terminals, the contact area of the power terminals must be substantially larger than the contact area of the signal terminals.

Structure of Subassembly 14

Included within the subassembly 14 are all of the components 14a thru 14d. Component 14a is a planar, rigid, support member. Component 14b is a spring which is mounted to the support member 14a, and component 14c is a temperature regulating member that is held by the spring 14b. This temperature regulating member 14c can be a heat sink which removes heat from the electronic device 12c, a heater which adds heat to the electronic device 12c, or a combination of a heat sink and a heater. In each case, the heat is removed from or added to the electronic device 12c thru thermal conduction by pressing the two components 12c and 14c together. Component 14d is a stop which limits how hard the spring 14b can press component 14c against the electronic device 12c.

Structure of Subassembly 15

Included within the subassembly 15 are all of the components 15a thru 15g. Component 15a is a rigid support member which is attached to the frame 11 and which holds all of the components 15b thru 15g. Components 15b and 15c are a pair of arms which are connected by a joint 15d that pivots. Arm 15b also has an end 15e which slides on the support member 15a; and, arm 15c has an end 15f which slides on the support member 15a. End 15f is also coupled by a spring 15g to the frame 11 as shown.

In FIG. 1, two pairs of the arms 15b and 15c are provided; and the pivot joint 15d between each pair of arms pushes against the support member 14a. . When each arm 15b is moved to an open position as shown, the angle "θ" between the arms 15b and 15c is large; and consequently, the subassemblies 12, 13 and 14 are spaced apart from each other. By comparison, when each arm 15b is moved to a closed position as shown, the angle "θ" between the arms 15b and 15c is small; and consequently, the subassemblies 12, 13 and 14 are pressed together.

Preferred Internal Structure for Fault Detection Circuit 13c and Power Supply 13b With reference now to FIG. 2, one preferred internal structure for the fault detection circuit 13c will be described, along with one preferred internal structure for the power supply 13b. In the FIG. 2 embodiment, the fault detection circuit 13c has the internal parts 21–24, T1–T4, R1, and R2. All of these parts are interconnected as shown.

The internal part 21 is a microprocessor which executes a control program CP that is stored in a memory 21a. This control program CP specifies a sequence of several steps which constitute a fault detection process. A command to start executing the control program CP is sent to the microprocessor 21 on an I/O bus from an external source.

During the execution of the control program CP, the microprocessor 21 sends output signals on three sets of conductors C5, C6 and C7; and the microprocessor 21 receives input signals on another set of conductors C8. The output signals on the conductors C5 are sent to the power supply 13b, and they selectively put the power supply in an ON-state or an OFF-state. When the power supply 13b is in the ON-state, the output voltage VO is generated. When the power supply 13b is in the OFF-state, no output voltage is generated.

The output signals on the conductors C6 and C7 are sent to the internal part 22, which is a digital register. This register has five outputs Q1–Q5. Five output signals on the conductor C6 are stored in the register 22 whenever the microprocessor 21 sends a clock signal on conductor C7.

From register 22, the signals on the five outputs Q1–Q5 are sent respectively to the five internal parts of T1, T2, T3, T4 and 23. Parts T1 and T3 are P-channel field effect transistors; parts T2 and T4 are N-channel field effect transistors; and part 23 is a 2×1 analog multiplexer.

When the signal from register output Q1 is a "0", transistor T1 turns on; and that couples a positive voltage to the conductor C3b. Conversely, when the signal from the register output Q2 is a "1", transistor T2 turns-on; and that couples a ground voltage to the conductor C3b.

Internal part R1 is a resistor which is coupled from the conductor segment C2 to the conductor C3b to the conductor C1b. Consequently, when transistor T1 turns on, a current may flow thru the register R1. Whether or not this current actually flows will depend on several factors which will be described later in conjunction with FIGS. 3B and 3C.

Similarly, when the signal from the register output Q3 is a "0", transistor T3 turns on; and that couples a positive voltage to the conductor C4b. And, when the signal from the register output Q4 is a "1", transistor T4 turns on; and that couples a ground voltage to the conductor C4b.

Internal part R2 is a resistor which is coupled from the conductor C4b to the conductor C2b. Consequently, when transistor T3 turns on, a current may flow thru the resistor R2. Whether or not this current actually flows will depend on several factors which will be described in conjunction with FIGS. 3D and 3E.

In order to sense the voltages that are caused by any currents flowing thru the resistors R1 and R2, the conductors C3b and C4b are coupled to respective inputs on the multiplexer 23. The voltage on conductor C3b is passed thru multiplexer 23 when output Q5 of register 22 is a "1", and the voltage on conductor C4b is passed thru multiplexer 23 when output Q5 of register 22 is a "0". Then the output of multiplexer 23 is sent thru the internal part 24, which is an analog-to-digital converter, to the microprocessor 21.

Figure 2:
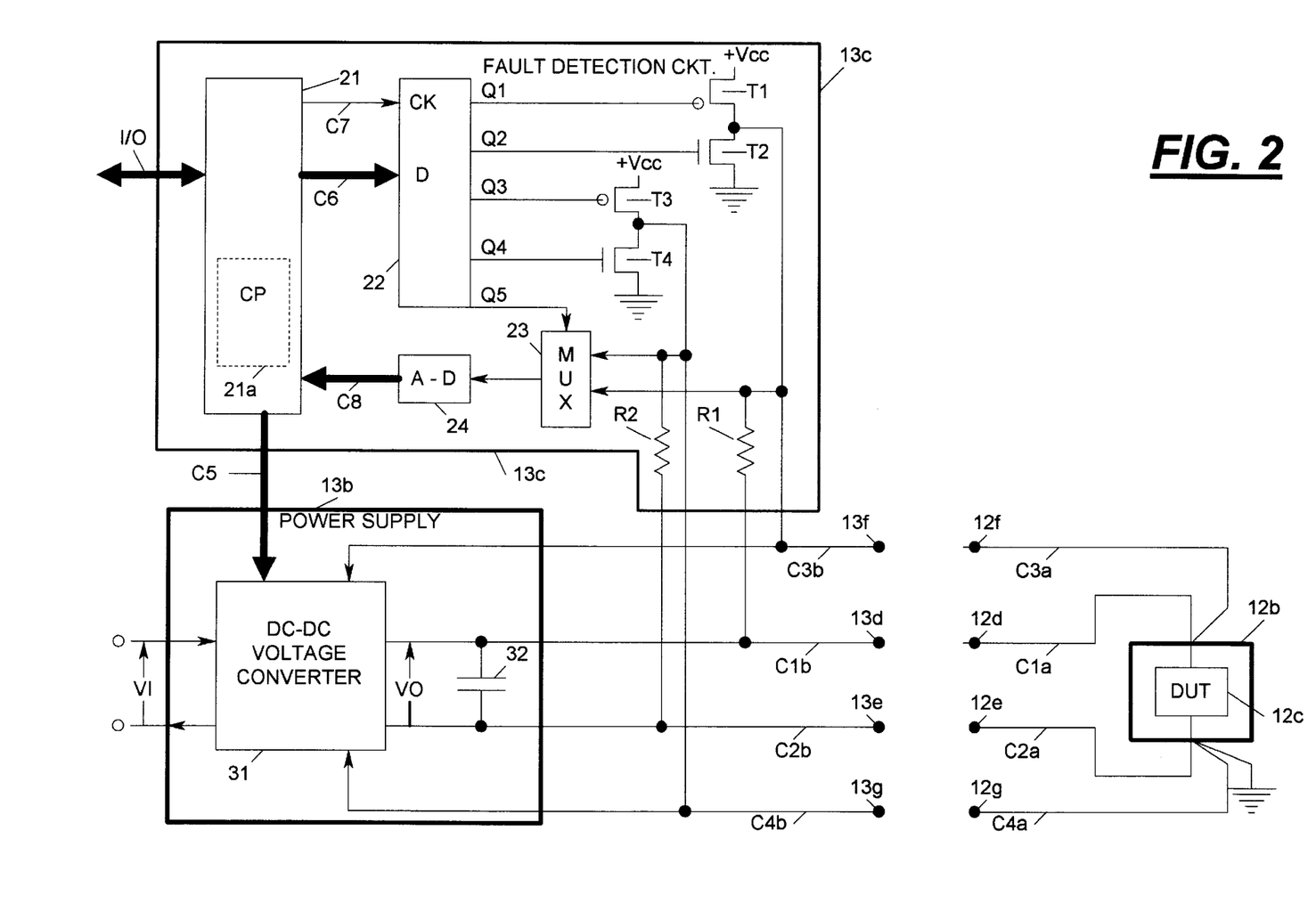
FIG. 2 shows the internal details of one preferred embodiment of a fault detection circuit and a power supply which are in the FIG. 1 system.

Also in the FIG. 2 embodiment, the power supply 13b has two internal parts 31 and 32. Part 31 is a DC-DC converter, and part 32 is a capacitor. Electrical power is put into the DC-DC converter 31 at a large constant voltage VI, and electrical power is taken from the DC-DC voltage converter 31 at a much smaller constant voltage VO. As one example, voltage VI is 150 volts, whereas voltage VO is 3 volts. The voltage VO is generated across the capacitor 32 to help hold the output voltage constant.

Normal Operation of FIG. 2 Circuitry

The normal operation of the FIG. 2 circuitry is illustrated in FIG. 3. During this normal operation, the transistors T1–T4 are turned-OFF; the four pressed contacts 12d–13d, 12e–13e, 12f–13f, and 12g–13g are closed; and the power supply 13b is sending a load current 41 to the electronic device 12c which is held by the socket 12b. This load current 41 travels to the electronic device 12c along the conductors C1b and C1a, and it travels back to the power supply 13b along the conductors C2a and C2b.

Also during the normal operation that is shown in FIG. 3, the voltages which occur on the power input terminal and power output terminal of the socket 12b are fed back to the power supply 13b. The voltage on the power input terminal of the socket 12b travels along conductors C3a and C3b to the power supply 13b; and the voltage on the power output terminal of the socket 12b travels along the conductors C4a and C4b to the power supply 13b. These two feedback voltages are then used within the DC-DC voltage to converter 31 to adjust the output voltage VO such that the voltage across the socket 12b equals a value that is selected by the control signals on the conductors C5.

Figure 3A:
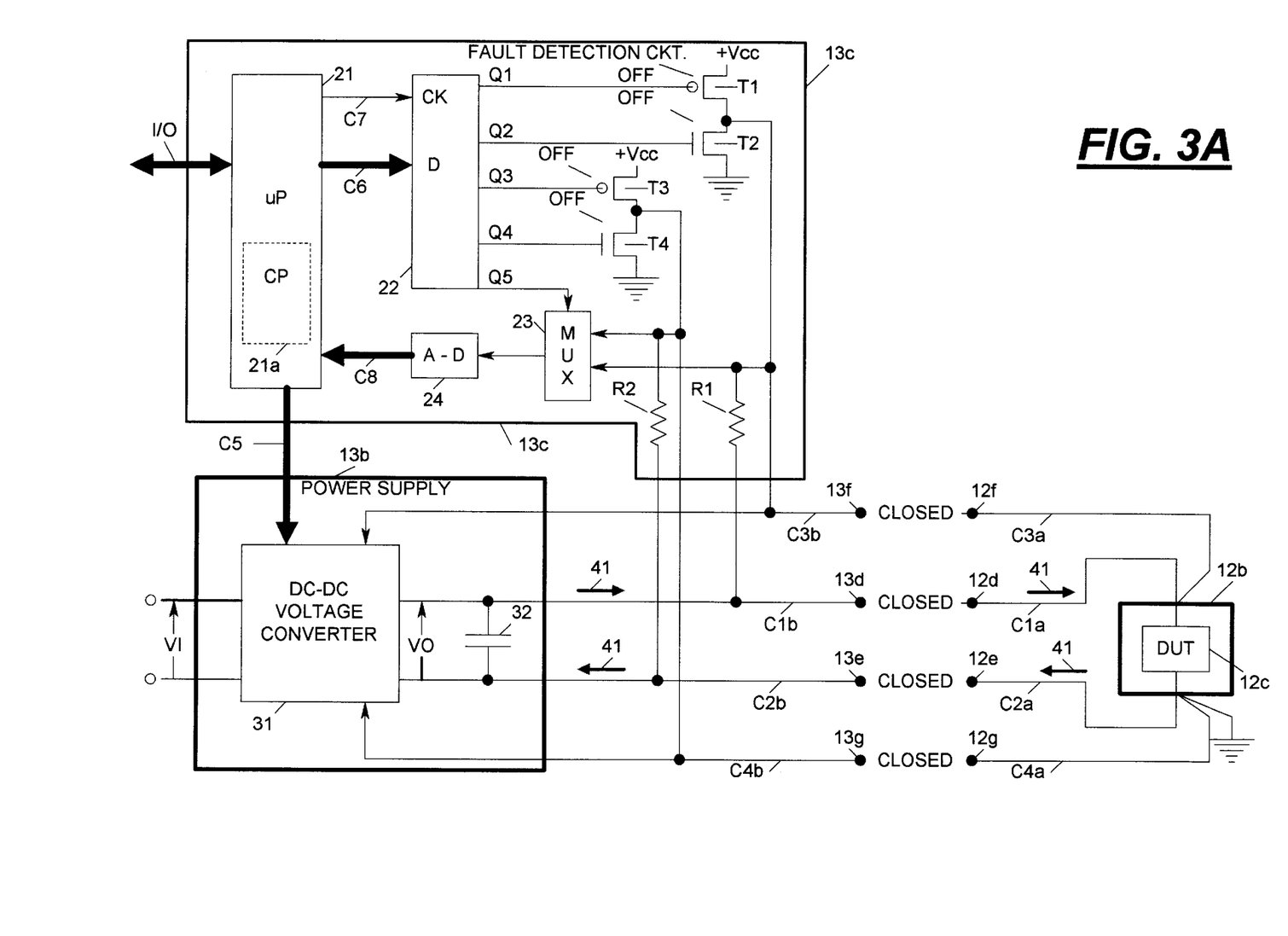
FIG. 3A shows the normal operation of the power supply in FIG. 2.

The above adjusting of the output voltage VO will only work if all four of the pressed contacts 12d–13d, 12e–13e, 12f–13f, and 12g–13g are closed. However, contacts 12f–13f and/or contacts 12g–13g can become open due to misalignments that are caused by manufacturing tolerances, as was previously described under the heading "Details of Subassembly 13". But, with the fault detection circuit 13c, an open contact 12f–13f and/or an open contact 12g–13g can be detected.

Detection of an Open Contact 12f–13f

Figure 3B:
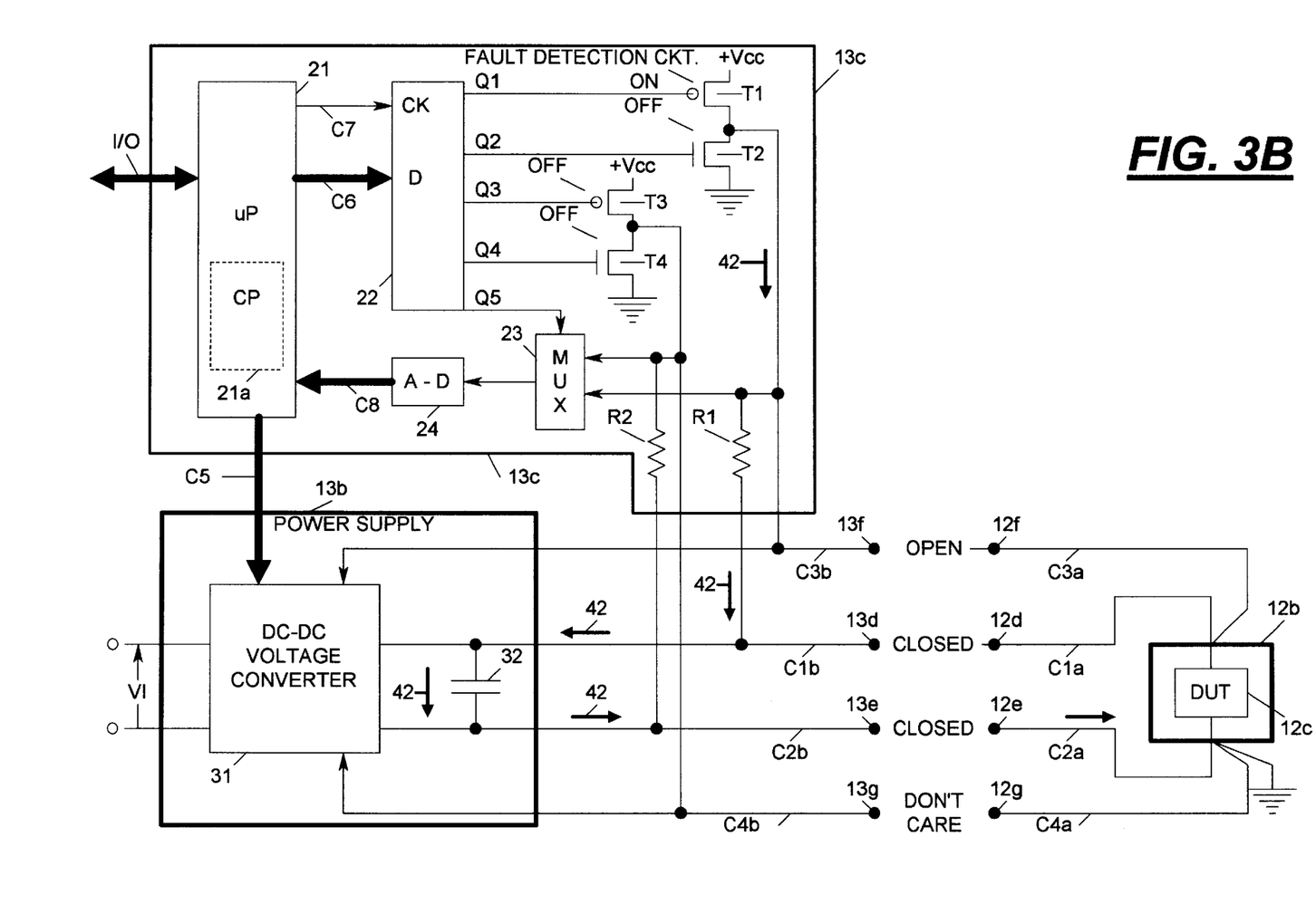
FIG. 3B shows how the fault detection circuit of FIG. 2 detects that a pressed contact is open, in a positive voltage feedback loop.

The detection of an open contact 12f–13f is illustrated in FIG. 3B. To detect this open contact, the power supply 13b is put into the OFF-state by the output signals on the conductors C5. Also, transistor T1 is turned on, and transistors T2–T4 are turned off, by the signals from outputs Q1–Q4 of register 22.

Due to the above state of the power supply 13b and the transistors T1–T4, a current 42 will flow as shown. That current 42 is sent along from the conductor C1b thru the capacitor 32, then it travels along the conductor C2b thru the closed contact 12e–13e; and then it travels along the conductor C2b to ground. The current 42 does not travel from transistor T1 thru the pressed contact 12f–13f because that contact is open.

When the current 42 starts to pass thru the capacitor 32, that capacitor will begin to charge up. Initially, however, essentially no voltage is dropped across the capacitor 32. At that time the voltage across the resistor R1 is sensed in microprocessor 21 by passing the voltage from the conductor segment C2 thru the multiplexer 23 and the analog-to-digital converter 24. If the voltage from the analog-to-digital converter 24 exceeds a predetermined threshold VT1, then that is interpreted by the microprocessor 21 as contact 12f–13f being open.

Detection of a Closed Contact 12f–13f

Figure 3C:
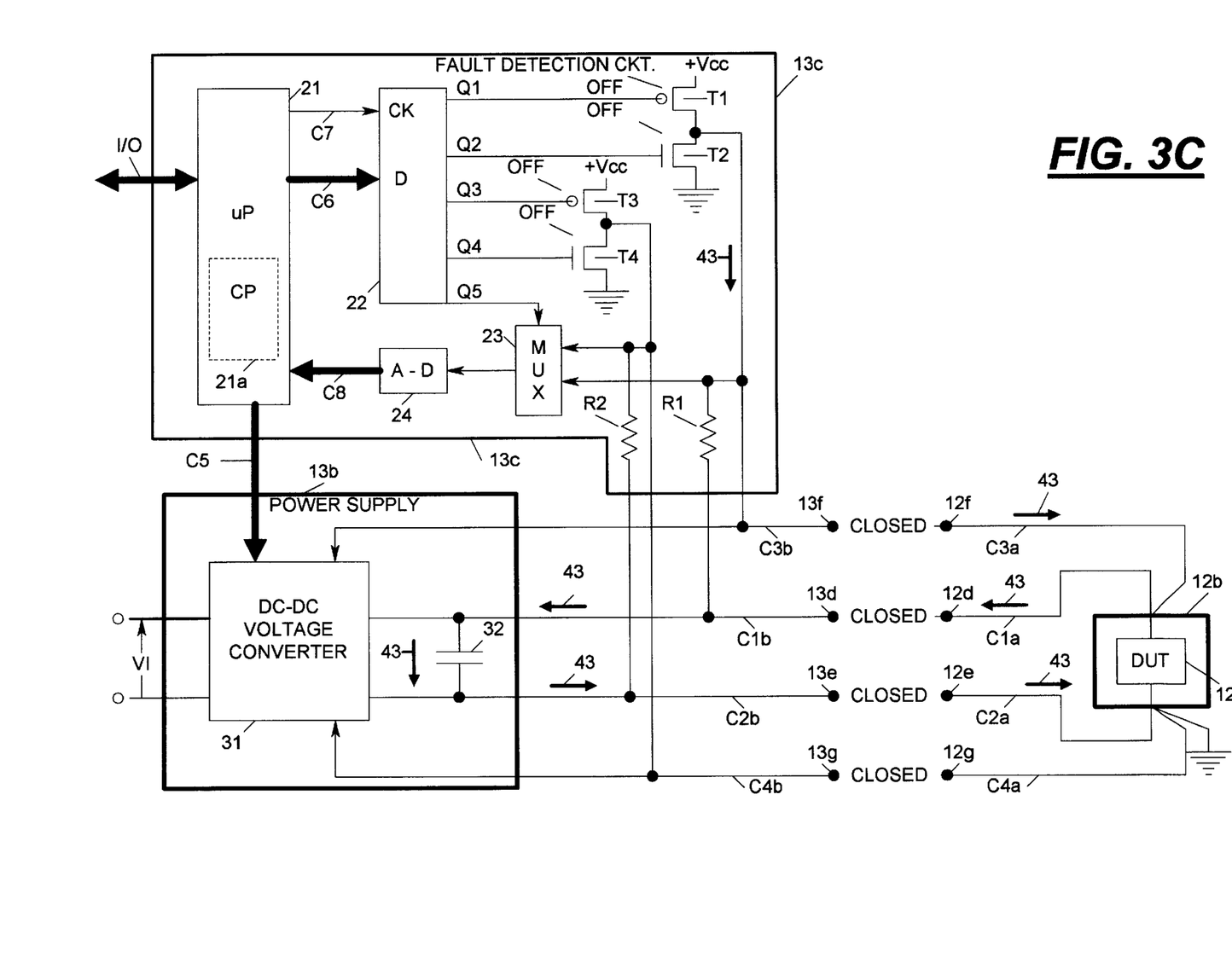
FIG. 3C shows how the fault detection circuit of FIG. 2 detects that a pressed contact is closed in a positive voltage feedback loop.

The detection of a closed contact 12f–13f is illustrated in FIG. 3C. To detect this closed contact, the power supply 13b and the transistors T1–T4 are put in the same state as they are in FIG. 3B. As a result, a current 43 will flow as shown by the arrows in FIG. 3C.

Current 43 is sent from transistor T1 thru the closed contact 12f–13f; then it travels along the conductors C3a and C1a thru the closed contact 12d–13d; then it travels along the conductor C1b thru the capacitor 32; then it travels along the conductor C2b thru the closed contact 12e–13e; and then it travels along the conductor C2a to ground. The current 43 does not pass thru the resistor R1 because it takes the path of least resistance, which is thru the closed contact 12f–13f and the closed contact 12d–13d.

Since the current 43 does not pass thru the resistor R1, no voltage drop occurs across that resistor. Also the voltage across the capacitor 32 is essentially zero when the current 43 starts to flow. Thus, the initial voltage on the conductor C3b is essentially zero; and that voltage is sensed in microprocessor 21 by passing it thru the multiplexer 23 and the analog-to-digital converter 24. If the voltage from the analog-to-digital converter 24 is less than the threshold VT1, then that is interpreted by the microprocessor 21 as contact 12f–13f being closed.

Detection of an Open Contact 12g–13g

Figure 3D:
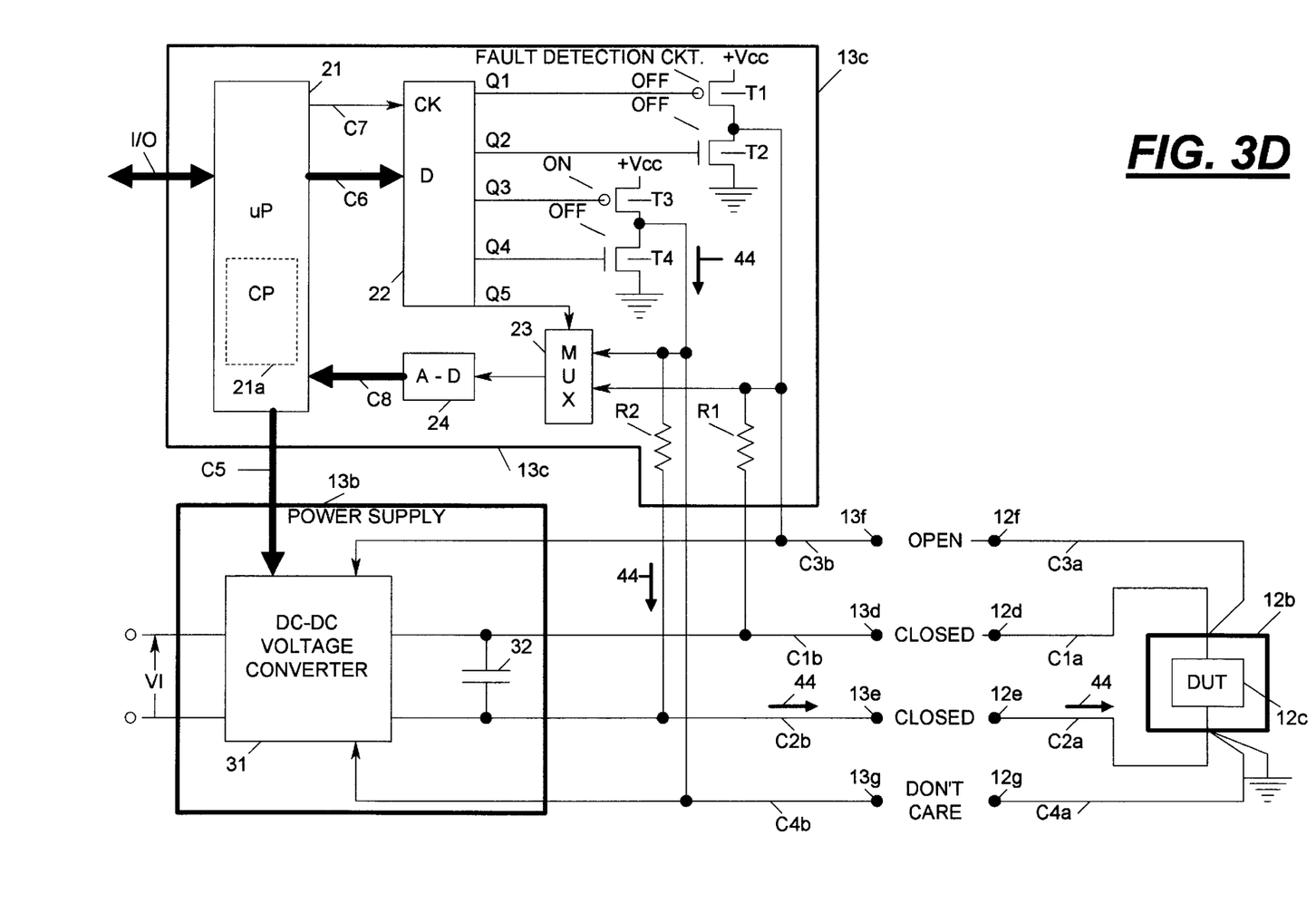
FIG. 3D shows how the fault detection circuit of FIG. 2 detects that a pressed contact is open in a reference voltage feedback loop.

The detection of an open contact 12g–13g is illustrated in FIG. 3D. To detect this open contact, the power supply 13b is put into the OFF-state by the output signals on the conductors C5. Also, transistor T3 is turned-ON, and the transistors T1, T2 and T4 are turned-OFF, by the signals from outputs Q1–Q4 of register 22.

Due to the above state of the power supply 13b and the transistors T1–T2, a current 44 will flow as shown by the arrows in FIG. 3D. That current 44 is sent from transistor T3 thru resistor R2; then it travels from the conductor C2b thru the closed contact 12e–13e; and then it travels along the conductor C2a to ground. The current 44 does not travel thru the pressed contact 12g–13g because that contact is open.

As the current 44 passes thru the resistor R2, a voltage drop occurs across that resistor. This voltage is sensed in the microprocessor 21 by passing the voltage from the conductor C4b thru the multiplexer 23 and the analog-to-digital converter 24. If the voltage from the analog-to-digital converter 24 exceeds a predetermined threshold VT2, then that is interpreted by the microprocessor 21 as contact 12g–13g being open.

Detection of a Closed Contact 12g–13g

Figure 3E:
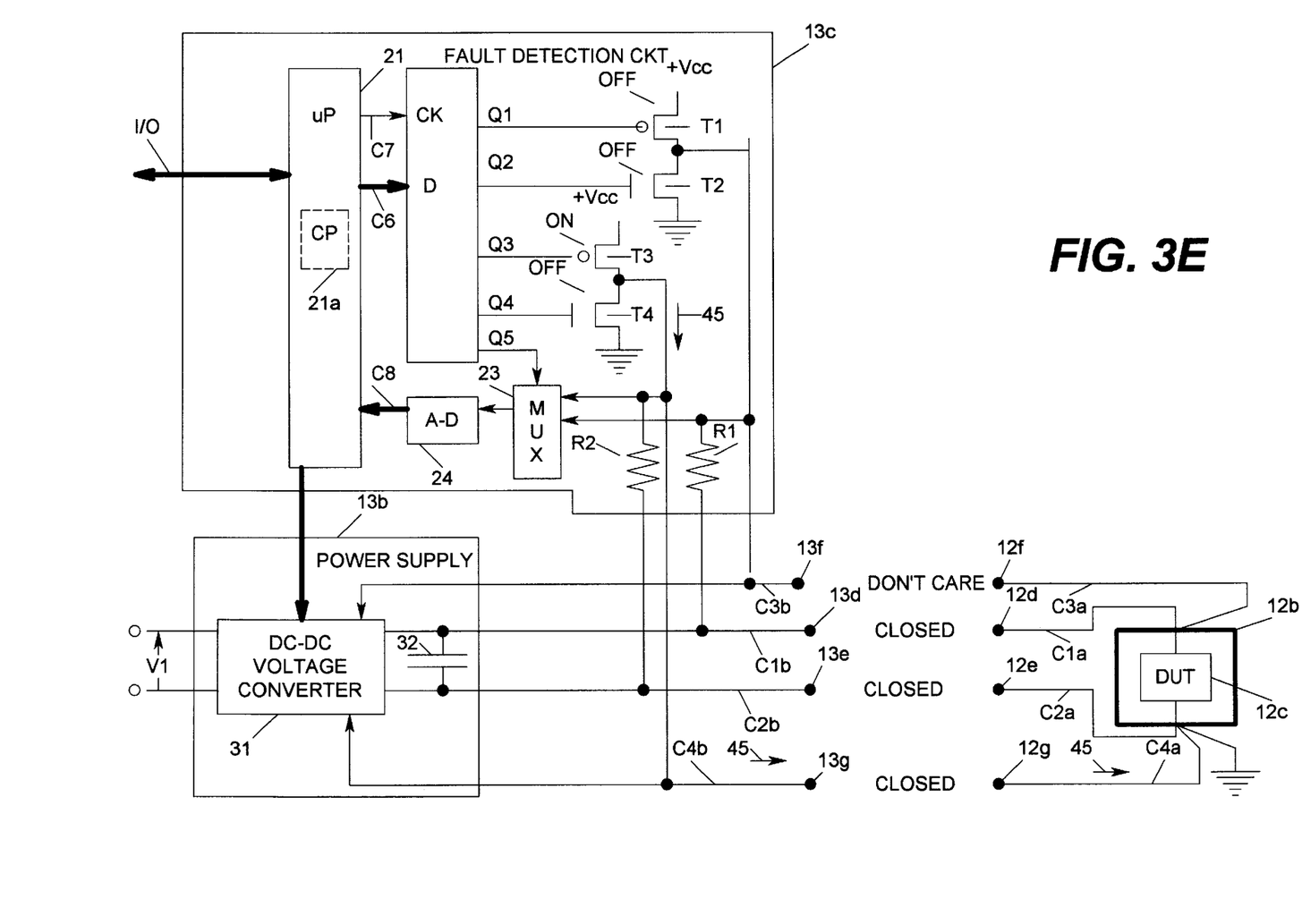
FIG. 3E shows how the fault detection circuit of FIG. 2 detects that a pressed contact is closed in a reference voltage feedback loop.

The detection of a closed contact 12g–13g is illustrated in FIG. 3E. To detect this closed contact, the power supply 13b and the transistors T1–T2 are put in the same state as they are in FIG. 3D. As a result, a current 45 will flow as shown by the arrows in FIG. 3E.

Current 45 is sent from transistor T3 thru the closed contact 12g–13g; and then, it travels along the conductor C4a to ground. Current 45 does not pass thru the resistor R2 because it takes the path of least resistance, which is thru the closed contact 12g–13g.

Since the current 45 does not pass thru the resistor R2, no voltage drop occurs across that resistor. Thus, the voltage on the conductor C4b is essentially zero; and that low voltage is sensed in the microprocessor 21 by passing it thru the multiplexer 23 and the analog-to-digital converter 24. If the voltage from the analog-to-digital converter is less than the threshold VT2, then that is interpreted by the microprocessor 21 as contact 12g–13g being closed.

Steps Performed by Microprocessor 21

Figure 4:
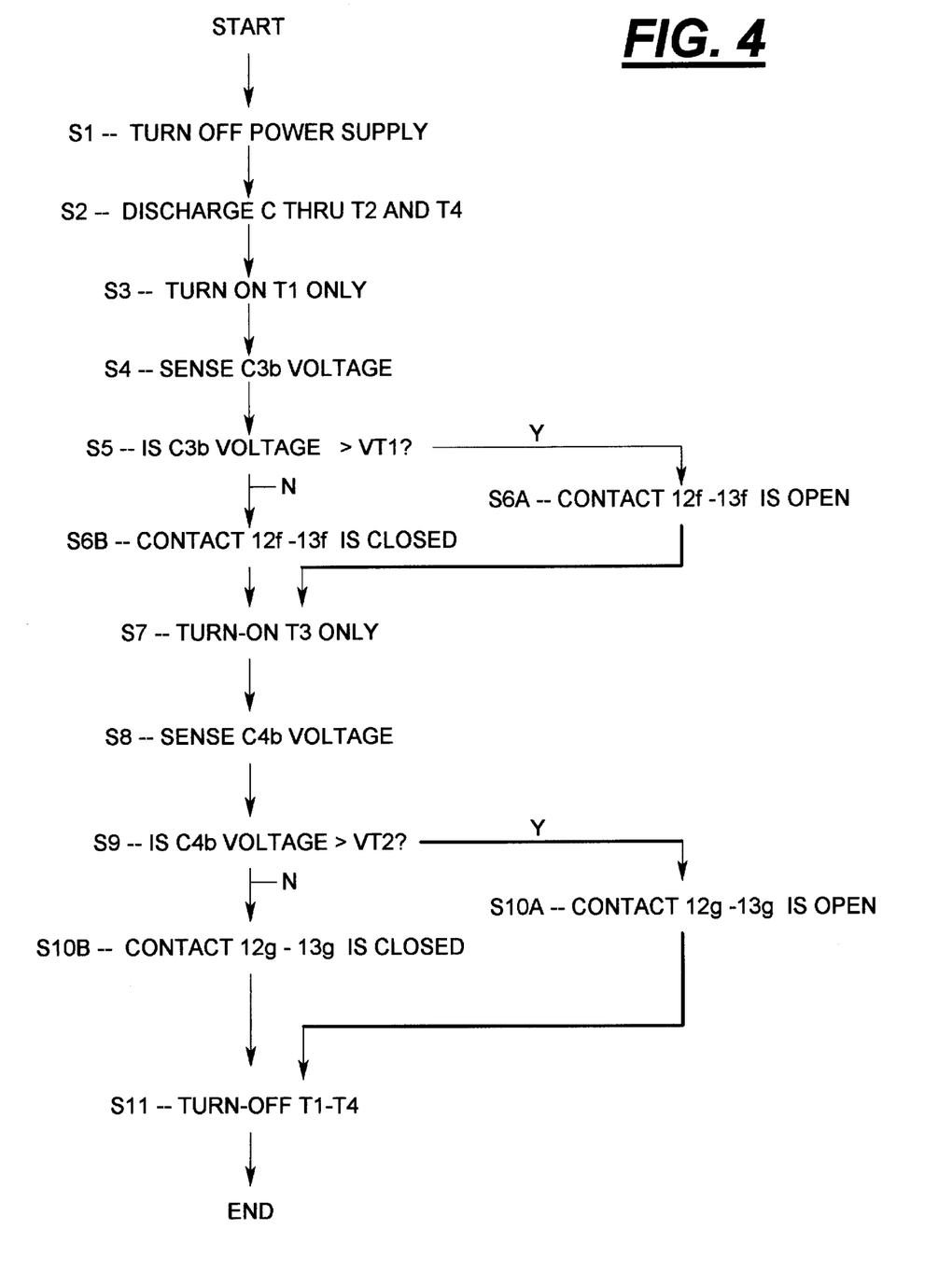
FIG. 4 is a flow chart which shows a sequence of steps by which a microprocessor, in the fault detection circuit of FIG. 2, detects the open and closed contacts in accordance with FIGS. 3B–3E.

To detect the open and closed state of the pressed contacts 12f–13f and 12g–13g, the microprocessor 21 performs a sequence of steps S1–S11 which is shown in FIG. 4. This sequence of steps is specified by the control program CP which is stored in the memory 21a of the microprocessor 21.

In step S1, the microprocessor 21 puts the power supply 13b in an OFF-state. This is achieved by sending control signals to power supply 13b on the conductors C5.

Next, in step S2, the microprocessor 21 discharges any voltage which may be held in capacitor 32. This is achieved by writing a "1111" into the Q1–Q4 outputs of register 22. That causes transistors T2 and T4 to turn-ON, and cause transistors T1 and T3 to turn-OFF.

Then, in step S3, the microprocessor 21 turns-ON transistor T1 and turns-OFF transistors T2, T3 and T4. This is done by writing a "0010" into the Q1–Q4 outputs of register C2b. As a result, the current 42 of FIG. 3B will flow if contact 12f–13f is open; and the current 43 of FIG. 3C will flow if contact 12f–13f is closed.

Next in step S4, the microprocessor 21 senses the voltage which is across resistor R1. This is achieved by passing the voltage on the conductor C3b thru the multiplexer 23 and the analog-to-digital converter 24.

Then in step S5, the microprocessor 21 compares the threshold voltage VT1 to the voltage which is sensed in step S4. If the sensed voltage on the conductor C3b exceeds the threshold voltage VT1, then step S6A is performed. Otherwise, step S6B is performed.

In step S6A, the microprocessor 21 sends a message on the I/O bus to a computer monitor (not shown) which indicates that contact 12f–13f is open. Then in response, an operator can take corrective action. In step S6B, the microprocessor 21 sends a message on the I/O bus to the computer monitor which indicates that contact 12f–13f is closed.

Next in step S7, the microprocessor 21 turns on transistor T3 and turns off transistors T1, T2, and T4. This is done by writing a "1000" into the Q1–Q5 outputs of register 22. As a result, the current 44 of FIG. 3D will flow if contact 12g–13g is open, and the current 45 of FIG. 3E will flow if contact 12f–13f is closed.

Then in step S8, the microprocessor 21 senses the voltage which is across resistor R2. This is achieved by passing the voltage on the conductor C4b thru the multiplexer 23 and the analog-to-digital converter 24.

Next in step S9, the microprocessor 21 compares the threshold voltage VT2 to the voltage which it sensed in step S8. If the sensed voltage on the conductor C4b exceeds the threshold voltage VT2, then step S10A is performed. Otherwise, step S10B is performed.

In step S10A, the microprocessor 21 sends a message on the I/O bus which indicates that contact 12g–13g is open. Conversely, in step S10B, the microprocessor 21 sends a message on the I/O bus which indicates that contact 12g–13g is closed.

Then, after step S10A or step S10B, the microprocessor 21 performs step S11 wherein the process of FIG. 4 is terminated by turning off all of the transistors T1–T2. This is done by writing a "1010" into the Q1–Q4 outputs of register 22.

A preferred embodiment of a power system which incorporates the present invention has now been described in detail. In addition, however, various changes can be made to the details of the above embodiment and still incorporate the present invention. Some examples of such changes will now be described with reference to FIG. 5.

Figure 5:
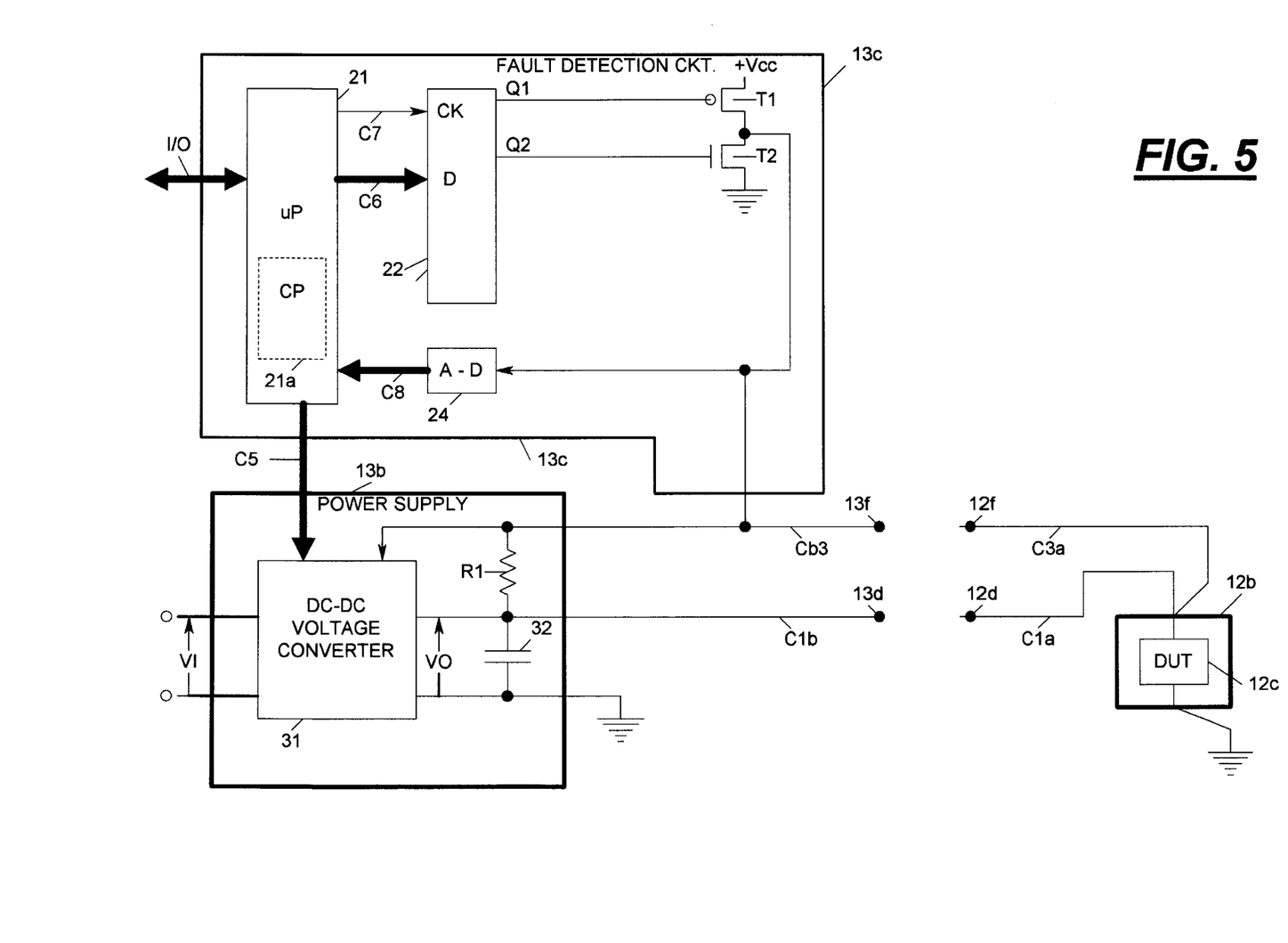
FIG. 5 shows various modifications which can be made to the fault detection circuit and the power supply of FIG. 2.

One change in FIG. 5, as compared to FIG. 2 and FIGS. 3A–3E, is that the conductors C2a, C2b, C4a and C4b have been eliminated along with their pressed contacts. Thus, in the normal operation of the power supply 13b in FIG. 5, a load current flows on conductor C1b thru the pressed contact 12d–13d, then on conductor C1a to the electronic device 12c, and then back to the power supply 13b thru a ground path which is indicated by the ground symbol.

Another change in FIG. 5, as compared to FIG. 2 and FIGS. 3A–3E, is that resistor R1 has been moved inside the power supply 13b. This location for resistor R1 illustrates that no external resistor R1 is needed if the power supply 13b already has a resistor R1 integrated between its load current output terminal and its positive voltage feedback input terminal.

A further change in FIG. 5, as compared to FIG. 2 and FIGS. 3A–3E, is that transistors T3–T4, multiplexer 23 and resistor R2 are eliminated. The elimination of these components occurs because there is no pressed contact 12g–13g in FIG. 5 to test for a defect. For that same reason, the control program CP in the memory 21a of FIG. 5 would be modified, in comparison to the control program of FIG. 4, such that steps S7, S8, S9, S10A and S10B are eliminated.

In view of the above, it is to be understood that the scope of the present invention is not limited to each particular detail in the illustrated embodiments but is defined by the appended claims.

What is claimed is:

1. A power system which is comprised of a power supply that has an output voltage terminal and an output voltage feedback terminal; said output voltage terminal being coupled by a first conductor to one pressed power contact which in turn is coupled by a second conductor to an electronic device; said electronic device being coupled by a third conductor to one pressed signal contact which in turn is coupled by a fourth conductor to said output voltage feedback terminal; and a fault detection circuit which is coupled to said fourth conductor wherein said fault detection circuit includes—a) a means for placing said power supply in an OFF-state in which said power supply generates no voltage on said output voltage terminal, b) a resistor means which couples said fourth conductor to said first conductor; c) a means for sending a current to said fourth conductor while said power supply is in said OFF-state; and d) a means for sensing whether or not at least a predetermined portion of said current passes thru said resistor means.

2. A power system according to claim 1 wherein said power supply and said fault detecting circuit are mounted on a first printed circuit board; said electronic device is mounted on a second printed circuit board; and said pressed power contact as well as said pressed signal contact lie on two surfaces that face each other on said first and second printed circuit boards.

3. A power system according to claim 1 wherein said pressed power contact has two mating terminals, and said pressed signal contact has two mating terminals that are substantially smaller than said mating terminals for said pressed power contact.

4. A power system according to claim 1 wherein said first conductor is coupled to a ground thru a capacitor, and wherein said means for sensing senses said current when an insignificant voltage drop occurs across said capacitor.

5. A power system according to claim 1 wherein said resistor means is external to said power supply.

6. A power system according to claim 1 wherein said resistor means is internal to said power supply.

7. A system which is comprised of a power supply that has an output voltage terminal and an output voltage feedback terminal; said output voltage terminal being coupled by a first conductor to one pressed power contact which in turn is coupled by a second conductor to an electronic device; said electronic device being coupled by a third conductor to one pressed signal contact which in turn is coupled by a fourth conductor to said output voltage feedback terminal; wherein said power supply also has a reference voltage terminal and a reference voltage feedback terminal; said reference voltage terminal being coupled by a fifth conductor to another pressed power contact which in turn is coupled by a sixth conductor to said electronic device; said electronic device being coupled by a seventh conductor to another pressed signal contact which in turn is coupled by an eighth conductor to said reference voltage feedback terminal; and a fault detection circuit which is coupled to said fourth conductor and said eighth conductor wherein said fault detection circuit includes —a) a means for placing said power supply in an OFF-state in which said power supply generates no voltage across said output voltage terminal and said reference voltage terminal, b) one resistor means which couples said fourth conductor to said first conductor, and another resistor means which couples said eighth conductor to said fifth conductor, c) a means for selectively sending a current to said fourth conductor or said eighth conductor while said power supply is in said OFF-state, and d) a means for sensing whether or not at least a predetermined portion of said current passes thru said one resistor means or said another resistor means.

8. A power system according to claim 7 wherein said power supply and said fault detection circuit are mounted on a first printed circuit board; said electronic device is mounted on a second printed circuit board; and all of said pressed power contacts as well as all of said pressed signal contacts lie on two surfaces that face each other on said first and second printed circuit boards.

9. A power system according to claim 7 wherein each of said pressed power contacts has two mating terminals, and each of said pressed signal contacts has two mating terminals that are substantially smaller than said mating terminals for said pressed power contacts.

10. A power system according to claim 7 wherein said first conductor is coupled to said fourth conductor thru a capacitor, and said means for sensing senses said current when an insignificant voltage drop occurs across said capacitor.

11. A power system according to claim 7 wherein said one resistor means and said another resistor means are external to said power supply.

12. A power system according to claim 7 wherein said one resistor means and said another resistor means are internal to said power supply.

* * * * *